United States Patent
Taravade et al.

(10) Patent No.: US 6,225,215 B1
(45) Date of Patent: *May 1, 2001

(54) METHOD FOR ENHANCING ANTI-REFLECTIVE COATINGS USED IN PHOTOLITHOGRAPHY OF ELECTRONIC DEVICES

(75) Inventors: Kunal Taravade; Gayle Miller; Gail Shelton, all of Colorado Springs, CO (US)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/405,805

(22) Filed: Sep. 24, 1999

(Under 37 CFR 1.47)

(51) Int. Cl.[7] .................. H01L 21/4763; H01L 21/31; H01L 21/44; G03C 5/00
(52) U.S. Cl. ................. 438/636; 438/780; 438/671; 430/290; 430/311
(58) Field of Search .................. 438/636, 780, 438/781, 782, 671; 430/20, 290, 318, 313, 311, 316, 323

(56) References Cited

U.S. PATENT DOCUMENTS

| | | | |
|---|---|---|---|
| 5,126,289 | 6/1992 | Ziger | 437/231 |
| 5,401,613 | * 3/1995 | Brewer et al. | 430/323 |
| 5,434,699 | 7/1995 | Berkovic et al. | 359/328 |
| 5,578,676 | 11/1996 | Flaim et al. | 524/609 |
| 5,580,701 | * 12/1996 | Lur et al. | 430/316 |
| 5,635,333 | 6/1997 | Petersen et al. | 430/311 |
| 5,642,040 | 6/1997 | Takahashi et al. | 324/96 |
| 5,741,626 | 4/1998 | Jain et al. | 430/314 |
| 5,744,537 | 4/1998 | Brunsvold et al. | 524/520 |
| 5,750,316 | 5/1998 | Kawamura et al. | 430/311 |

* cited by examiner

Primary Examiner—Charles Bowers
Assistant Examiner—Thanh J. Pham

(57) ABSTRACT

A method of fabricating an integrated circuit using photolithography and an antireflective coating. An antireflective coating is formed on a substrate wherein the antireflective coating is electrically polarizable. A photoresist coating is formed on the antireflective coating on a side opposite from the substrate and the photoresist is exposed to activating radiation. The antireflective coating is subjected to an applied electric field at substantially the same time as the photoresist is exposed to activating radiation. The radiation absorption coefficient of said antireflective coating is increased and the refractive index of said antireflective coating is changed to be substantially equal to the refractive index of said photoresist coating.

26 Claims, 7 Drawing Sheets

METHOD FOR ENHANCING ANTI-REFLECTIVE COATINGS USED IN PHOTOLITHOGRAPHY OF ELECTRONIC DEVICES

BACKGROUND OF THE INVENTION

1. Technical Field

The present invention relates to semiconductor photolithography methods and, more particularly, to antireflection coatings for use with photolithography.

2. Description of the Related Art

One step in the fabrication of semiconductor devices such as integrated circuits is the formation of a substrate pattern over a semiconductor wafer surface through photolithographic masking and etching. A photoresist coating over a substrate is selectively exposed to activating radiation directed through a mask defining the desired conductor pattern. After photoresist development, the photoresist layer constitutes a relief image mask over the substrate. The relief image mask defines open areas over the substrate in a desired image pattern to be transferred to the substrate. The image is transferred to the surface of the substrate by surface modification of the substrate in a negative image of the pattern within the photoresist coating, such as by removal of a portion of the substrate by an etching process or by implantation of an atomic species into the substrate. The etching is often done in a plasma etch reactor in which a plasma of ions reacts with and etches away the exposed substrate. During these processes, the coating of the photoresist in the image pattern functions as a protective mask to prevent surface modification of the substrate underlying the photoresist mask. The resolution of the image transferred to the substrate is dependent upon the resolution within the imaged photoresist coating.

There are factors in addition to the resolution capability of the photoresist used that influence the quality or resolution of the image transferred to a photoresist masked substrate. For example, with reflective integrated circuit substrates, such as aluminum, exposure of a photoresist coating causes reflection of diffused activating radiation (light) from the integrated circuit substrate back into the photoresist coating. Standard photoresists are susceptible to surface reflections which degrade the fine-line images required for integrated circuit manufacture. This degradation occurs due to reflection of diffused light from the integrated circuit substrate back into the photoresist layer resulting in exposure of the photoresist layer in areas where imaging is not desired. Another common result of surface reflections is the formation of "notches" in conductive lines in certain regions because of unwanted exposure of photoresist by reflected light. These "notches" can cause the device to fail, or even worse, to be unreliable.

To prevent reflection of activating radiation into a photoresist coating, it is well known to provide antireflective layers (ARC's) between a substrate and a photoresist layer. These antireflective layers typically comprise an absorbing dye dispersed in a polymer binder though some polymers contain sufficient chromophores whereby a dye is not required. When used, the dye is selected to absorb and attenuate radiation at the wavelength used to expose the photoresist layer thus reducing the incidence of radiation reflected back into the photoresist layer. During the conventional processing of an integrated circuit substrate coated with the combination of an antireflective layer and a photoresist layer, the photoresist is exposed to activating radiation and developed to form a relief image, i.e., portions of the photoresist layer are removed by development with a liquid developer and portions remain as a mask defining a desired pattern. To alter the underlying substrate, the antireflective layer must be removed to bare the substrate in a desired image. Removal of the antireflective layer may be by dissolution with a liquid that simultaneously dissolves both the photoresist and the antireflective layer or by dry etching such as with an oxygen plasma.

Unfortunately, present antireflective coatings are less than 100 percent effective and are often difficult to remove. Furthermore, removal of the antireflective coating often results in degradation of important device properties and inconsistent performance of antireflection coatings due to thickness variation and other factors limits performance of photolithography. Therefore, it is desirable to provide an antireflective coating and a photolithographic process that results in up to 100 percent efficiency and that can be more easily removed from the underlying substrate.

SUMMARY OF THE INVENTION

The present invention provides a method of fabricating an integrated circuit using photolithography and an antireflective coating. According to a preferred embodiment, an antireflective coating is formed on a substrate wherein the antireflective coating is electrically polarizable. A photoresist coating is formed on the antireflective coating on a side opposite from the substrate and the photoresist is exposed to activating radiation. The antireflective coating is subjected to an applied electric field at substantially the same time as the photoresist is exposed to activating radiation. The radiation absorption coefficient of said antireflective coating is increased and the refractive index of said antireflective coating is changed to be substantially equal to the refractive index of said photoresist coating.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION

Figure 1:
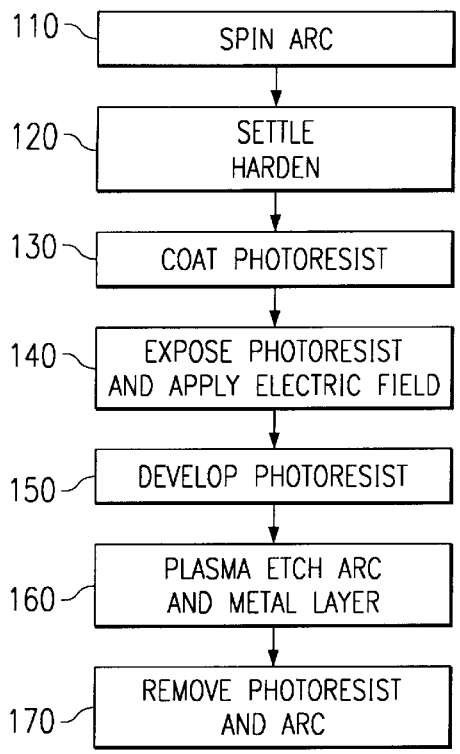
FIG. 1 shows a flow chart depicting successive steps in the photolithographic masking and etching of a layer such as a metal layer overlying a semiconductor substrate.
Figure 2:
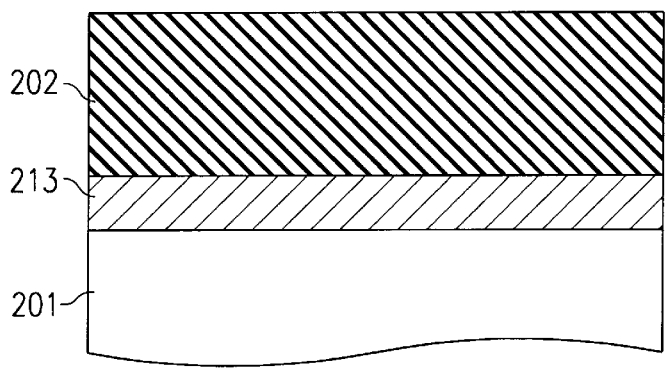
FIGS. 2–8 show cross sections of a wafer at various stages in the fabrication process.

Referring to FIG. 1, there is shown a flow chart depicting successive steps in the photolithographic masking and etching of a layer such as a metal layer overlying a semiconductor substrate. Referring to FIG. 2, the method is intended to create a conductor pattern in a conductive film 202 which overlies a semiconductor substrate 201 and is typically insulated from substrate 201 by a dielectric layer 213 of a material such as silicon dioxide. Referring again to FIG. 1, the first step (step 110) of the method is to spin an antireflection coating (ARC) 203 on the upper surface of the conductive film 202; that is, to deposit a fluid antireflection coating on the surface of conductive film 202 and then distribute it evenly over the surface of conductive film 202 by spinning substrate 201 in a manner well known in the art. Referring to FIG. 2, the thickness of antireflective coating 203 is preferably between approximately 0.07 microns and approximately 0.15 microns with a most preferable thickness of approximately 0.1 microns. Antireflective coating 203 is comprised of a polymer liquid crystal material that is electrically polarizable and may also contain a solvent such as cyclohexadone to facilitate adhesion and spreading on the wafer. More detail about this material is provided below.

Figure 3:
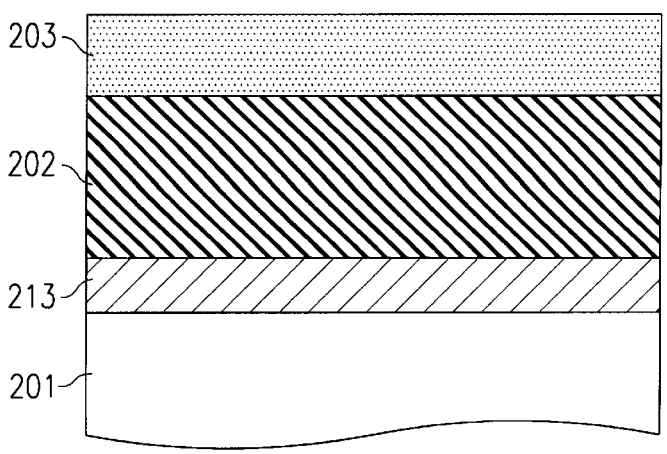

As shown in FIG. 1, the second step (step 120) is to permit the fluid antireflection coating 203 to settle and harden. If a polymer precursor is used, the hardening is the stop of polymerization, and if the fluid 203 is a polymer in a carrier, the hardening results from the evaporation of the carrier. Referring to FIG. 3, this step results in a planarized upper surface 233 of coating 203.

Figure 4:
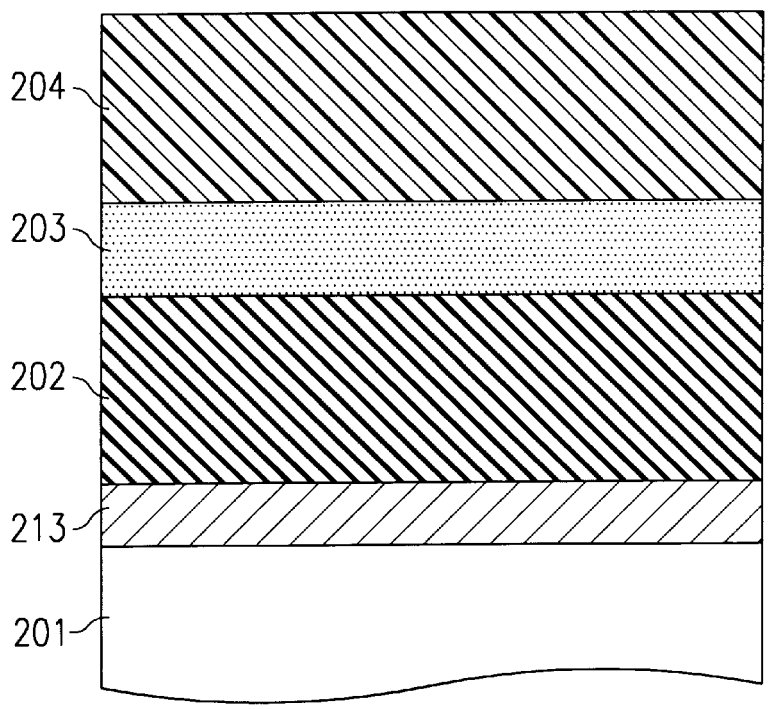

Referring again to FIG. 1, the next step (step 130) is to coat the upper surface 233 with a layer of photoresist 204. The photoresist is deposited and distributed, again, by spinning, as is well known in the art, which results in a photoresist layer 204 shown in FIG. 4. Because of the planarization of the upper surface 233 of antireflection coating 203, the photoresist layer 204 can be made to have a highly uniform thickness and a highly planar upper surface which are desired for some types of activating radiation.

Figure 5:
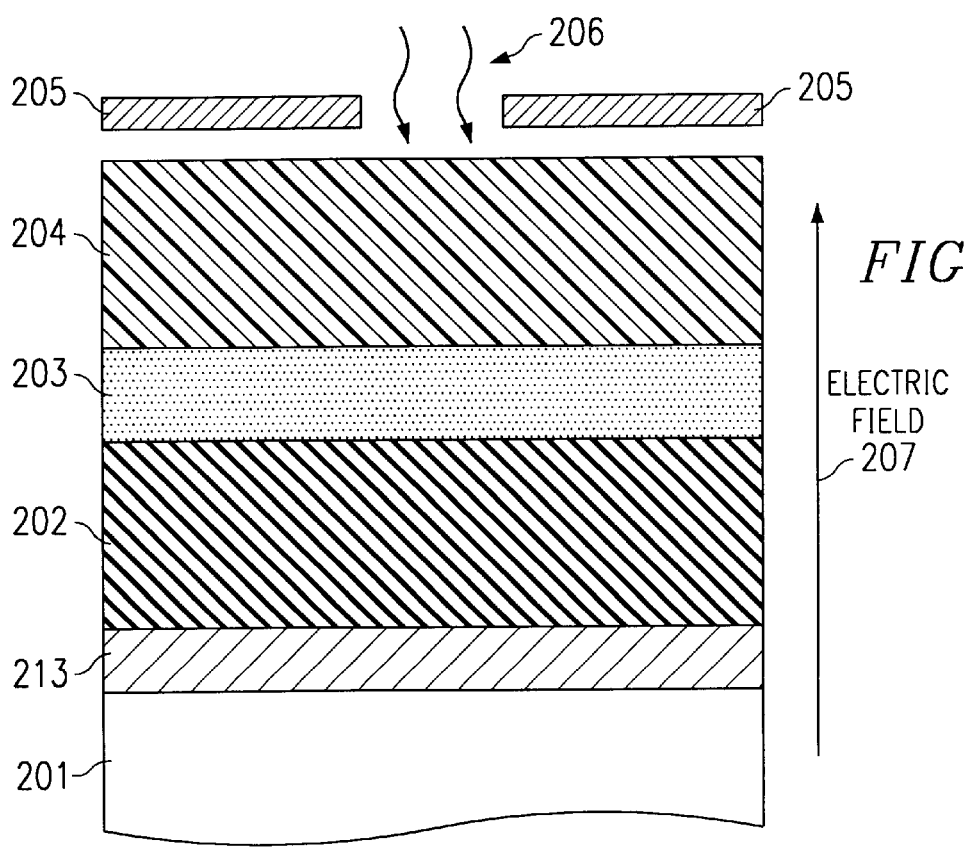

The next step (step 140) of FIG. 1 is to selectively expose photoresist 204 to activating radiation 206 while subjecting antireflective coating 203 to an applied electric field 207 as shown in FIG. 5. A mask 205 with areas that are transmissive to the wavelength and type of activating radiation 206 chosen is placed between photoresist 204 and the source of activating radiation 206 so that photoresist 204 will only be exposed to activating radiation in desired areas. The directions of the applied electric field 207 should be approximately normal to the planes of the interfaces between adjacent layers as shown in FIG. 5. It does not matter whether the electric field 207 is up (as shown in FIG. 5) or down as long as the applied electric field 207 is approximately normal to the planes of the interfaces between adjacent layers. The magnitude of applied electric field 207 is optimally between approximately 100 volts and 200 volts DC. The properties of antireflective coating 203 will be changed by this process such that the refractive index (n) of antireflective coating 203 will become approximately equal to the refractive index of photoresist 204 and the extinction coefficient ($k_{ARC}$) will be in the range of approximately 0.2 to approximately 0.5. In other words, $n_{ARC} \approx n_{resist}$ and $k_{ARC} = $ ~0.2 to ~0.5. Thus the optical properties of antireflective coating 203 are tuned to photoresist layer 204 above it.

Figure 6:
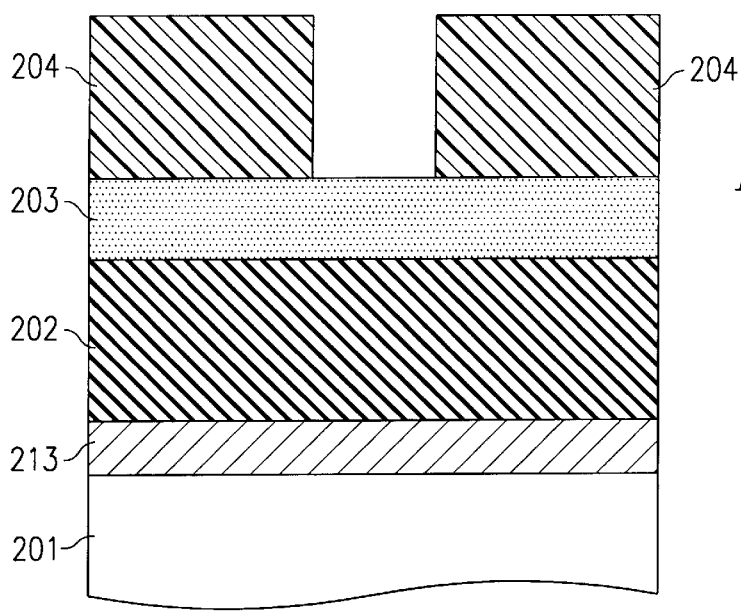
Figure 7:
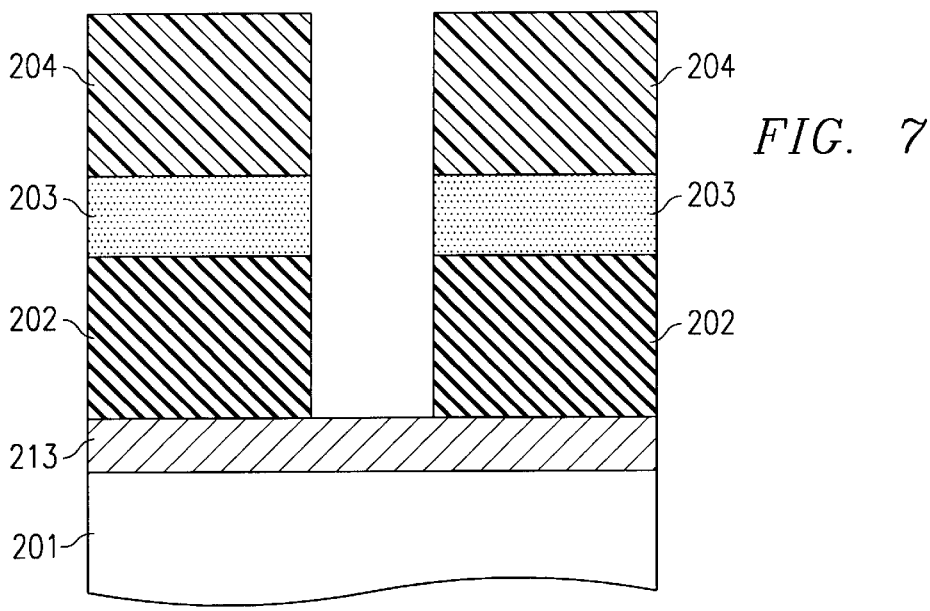
Figure 8:
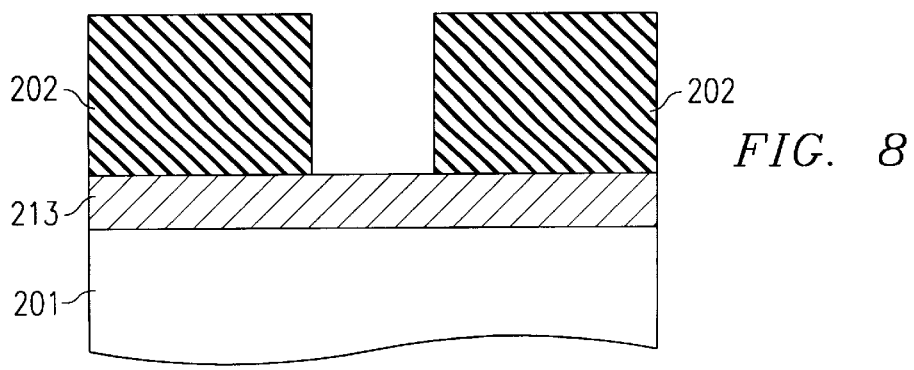

Next, photoresist 204 is developed (step 150). As is known in the art, development of photoresist coating 204 produces openings 254 in photoresist coating 204 describing the desired pattern to be formed in conducting layer 202 as shown in FIG. 6.

Next, antireflection coating 203 coating and conductive layer 202 are plasma etched (step 160 of FIG. 1). The type of plasma utilized depends on the type of material used as conductive layer 202. However, typical plasma etches may be oxygen or fluorine based etch chemistries of a type well known in the art. The etch stops on dielectric layer 213. Finally, after plasma etch (step 160 of FIG. 1), photoresist layer 204 and ARC layer 203 are removed by etching, as is well known in the art, so as to leave the patterned conductive layer 202.

Turning now to FIGS. 9–16, a more detailed description of the polymer liquid crystals suitable for use in ARC 203 is given. As mentioned above, ARC 203 comprises an electrically polarizable polymer liquid crystal. Polymer liquid crystals ("PLCs") are a class of materials that combine the properties of polymers with those of liquid crystals. These "hybrids" show the same mesophases characteristic of ordinary liquid crystals, yet retain many of the useful and versatile properties of polymers.

Figure 9:
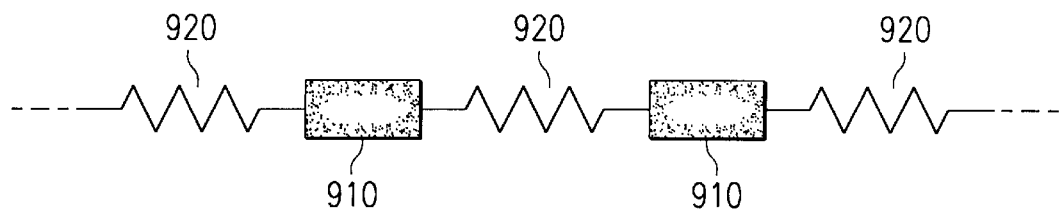
FIG. 9 shows a main chain polymer liquid crystal.
Figure 10A:
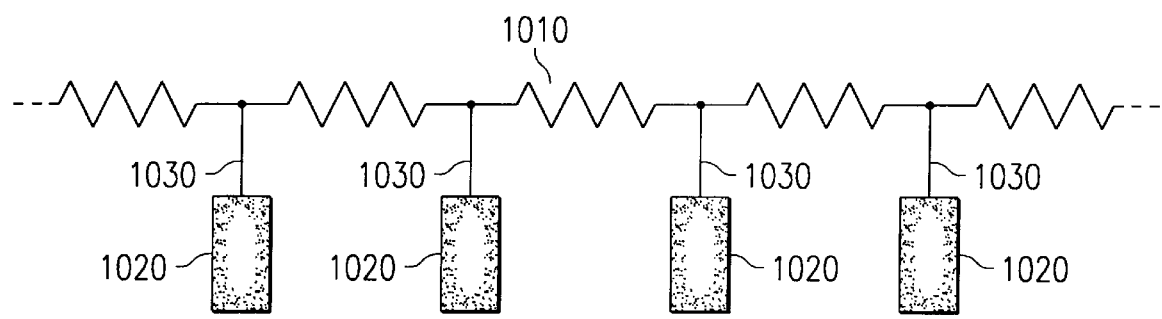
FIGS. 10A–10B show side chain polymer liquid crystals.
Figure 10B:
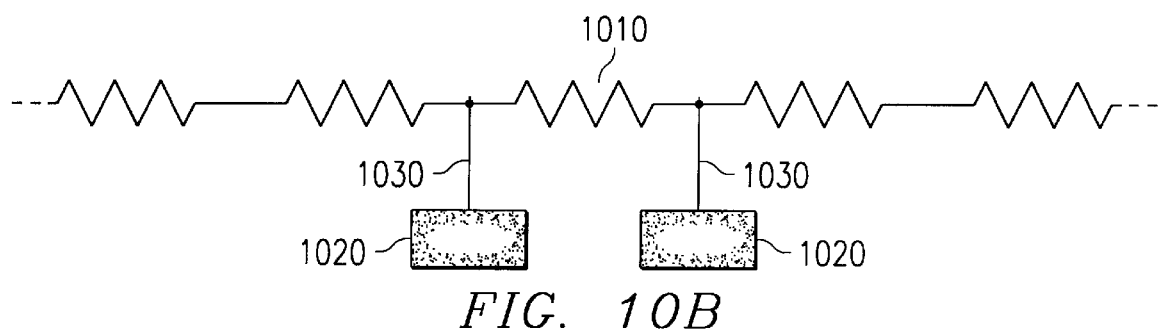

In order for normally flexible polymers to display liquid crystal characteristics, rod-like or disk-like elements (called mesogens) must be incorporated into their chains. The placement of the mesogens plays a large role in determining the type of PLC that is formed. Main-chain polymer liquid crystals ("MC-PLCs") are formed when the mesogens 910 are themselves part of the main chain of a polymer 920. An example of the structure of a MC-PLC is shown in FIG. 9. Conversely, side chain polymer liquid crystals ("SC-PLCs") are formed when the mesogens 1020 are connected as side chains to the polymer 1010 by a flexible "bridge" (called the spacer) 1030. Examples of SC-PLCs are shown in FIGS. 10A and 10B.

MC-PLCs are formed when rigid elements are incorporated into the backbone of normally flexible polymers. These stiff regions along the chain allow the polymer to orient in a manner similar to ordinary liquid crystals, and thus display liquid crystal characteristics. There are two distinct groups of MC-PLCs, differentiated by the manner in which the stiff regions are formed.

Figure 11A:
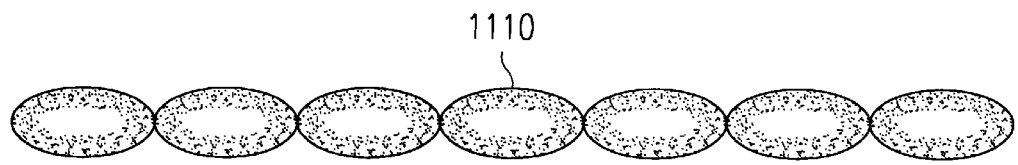
FIG. 11A depicts one type of main chain polymer liquid crystal.
Figure 11B:
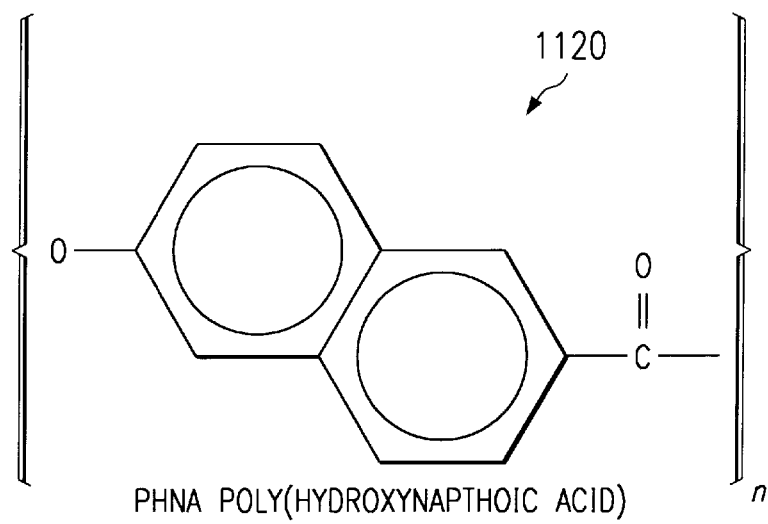
FIG. 11B shows PHNA poly(hydroxynapthoic acid), a molecule suitable as a monomer.

The first group of MC-PLCs is characterized by stiff, rod-like monomers. These monomers 1110 are typically made up of several aromatic rings 1120 that provide the necessary size. FIG. 11A shows an example of this kind of MC-PLC. FIG. 11B shows PHNA poly(hydroxynapthoic acid), a molecule suitable as monomer 1110.

The second and more prevalent group of MC-PLCs is different because it incorporates a mesogen directly into the chain. The mesogen acts just like the stiff areas in the first group. Generally, the mesogenic units are made up of two or more aromatic rings that provide the necessary restriction on movement that allow the polymer to display liquid crystal properties. The stiffness necessary for liquid crystallinity results from restrictions on rotation caused by steric hindrance and resonance. Another characteristic of the mesogen is its axial ratio. The axial ratio is defined to be the length of the molecule divided by the diameter (x=L/d). Experimental results have concluded that these molecules must be at least three times as long as they are wide. Otherwise, the molecules are not rod-like enough to display the characteristics of liquid crystals.

Figure 12A:
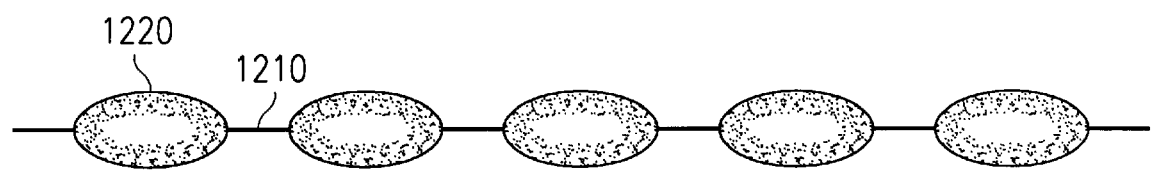
FIG. 12A depicts a second type of main chain polymer liquid crystal.
Figure 12B:
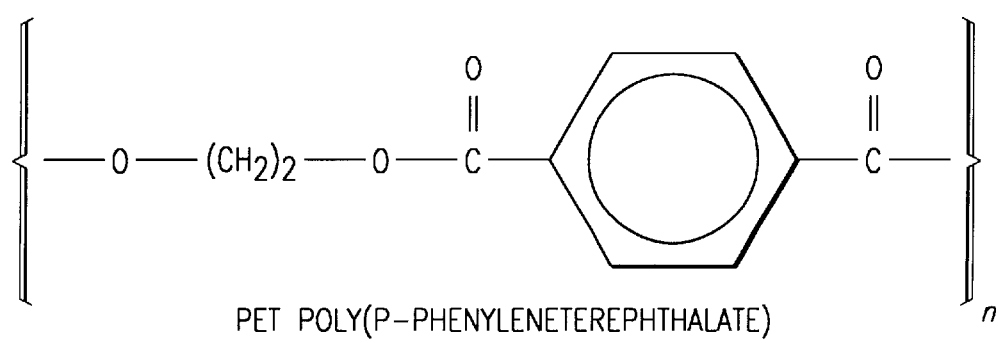
FIG. 12B shows an example of a suitable mesogen, in this case PET poly(p-phenyleneterephthalate).

This group is different from the first in that the mesogens are separated or "decoupled" by a flexible bridge called a spacer. Decoupling of the mesogens provides for independent movement of the molecules, which facilitates proper alignment. FIG. 12A shows a diagram of this type of MC-PLC. FIG. 12B shows an example of a suitable mesogen 1220, in this case PET poly(p-phenyleneterephthalate). Notice the flexible spacer 1210

(methylene groups) and the stiff mesogen 1220 (aromatic ring and double bonds).

Figure 13:
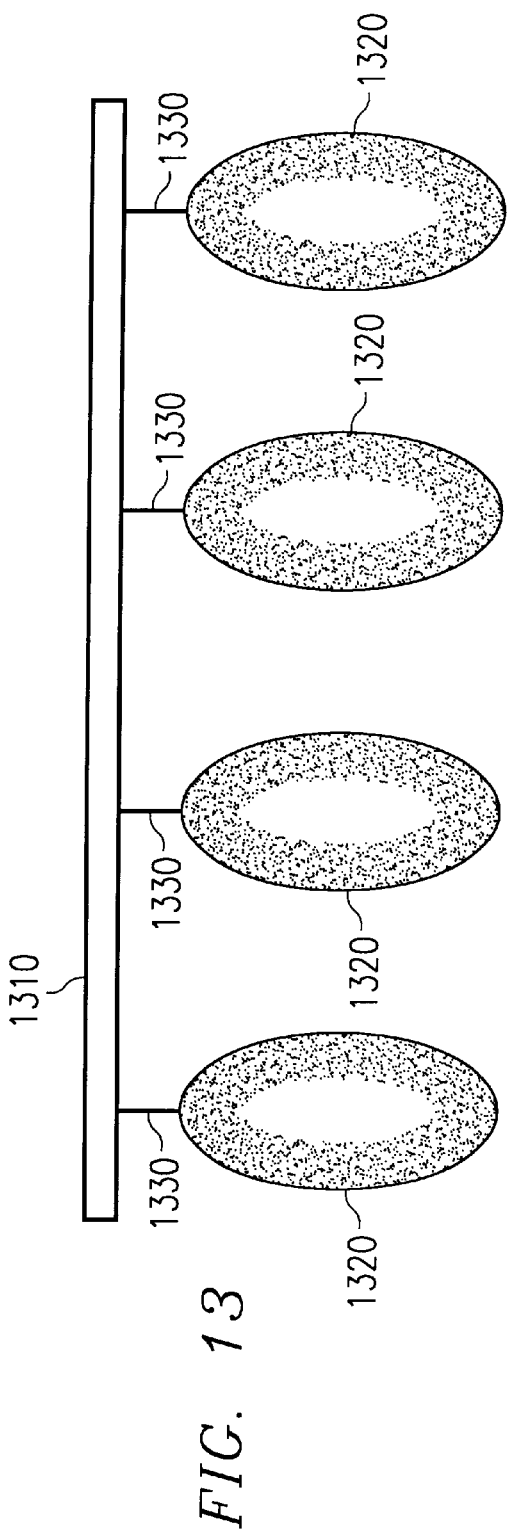
FIG. 13 depicts a side chain polymer liquid crystal.
Figure 14:
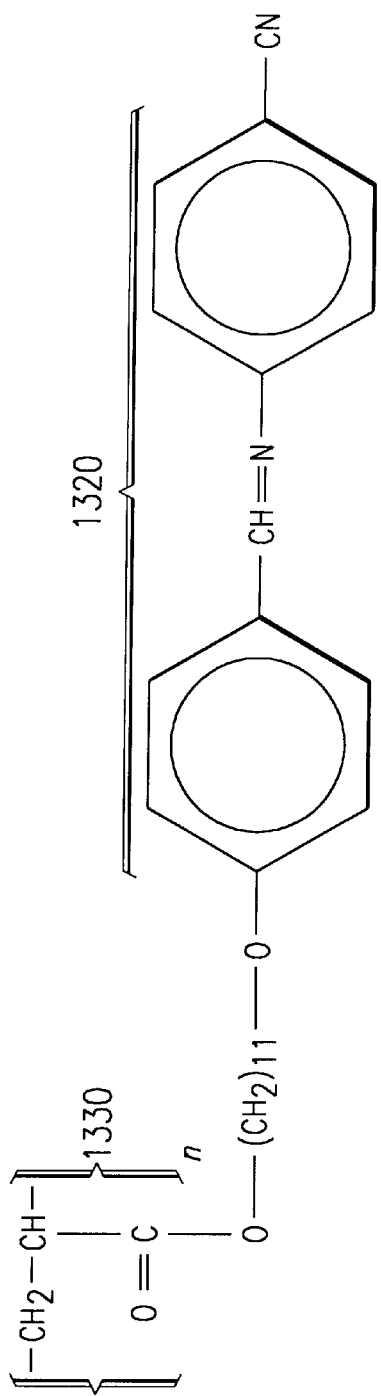
FIG. 14 depicts an example of a side chain and mesogen.
Figure 15:
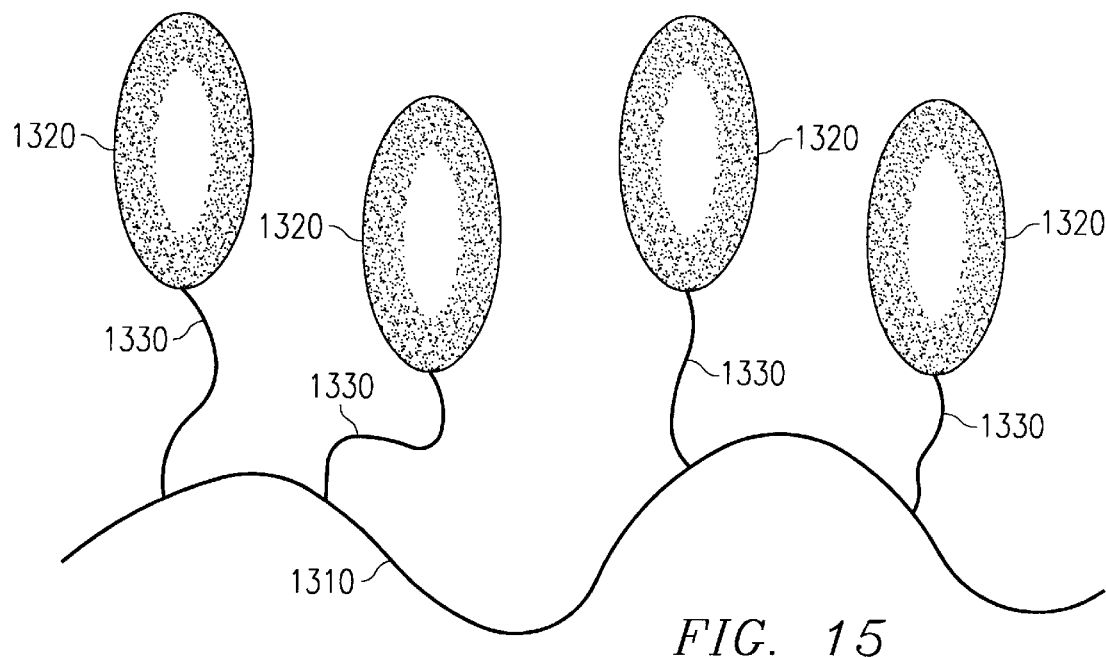
FIG. 15 shows a twisted side chain polymer liquid crystal.

SC-PLCs have three major structural components: the backbone 1310, the spacer 1330, and the mesogen 1320. FIG. 13 shows an example of a SC-PLC. The backbone 1310 of a SC-PLC is the element that the side chains 1320 and 1330 are attached to. The alignment of the mesogens 1320 causes the liquid crystal behavior. Usually, the mesogen 1320 is made up of a rigid core of two or more aromatic rings joined together by a functional group. FIG. 14 shows a diagram of a typical repeating unit (mesogen 1320) in a side chain polymer liquid crystal. Notice the spacer 1330 of methylene units and the mesogen 1320 of aromatic rings.

Like their main chain counterparts, mesogens 1320 attached as side groups on the backbone 1310 of SC-PLCs are able to orient because the spacer 1330 allows for independent movement. Notice, in FIG. 15, that even though the polymer backbone 1310 may be in a tangled conformation, orientation of the mesogens 1320 is still possible because of the decoupling action of the spacer 1330.

Figure 16:
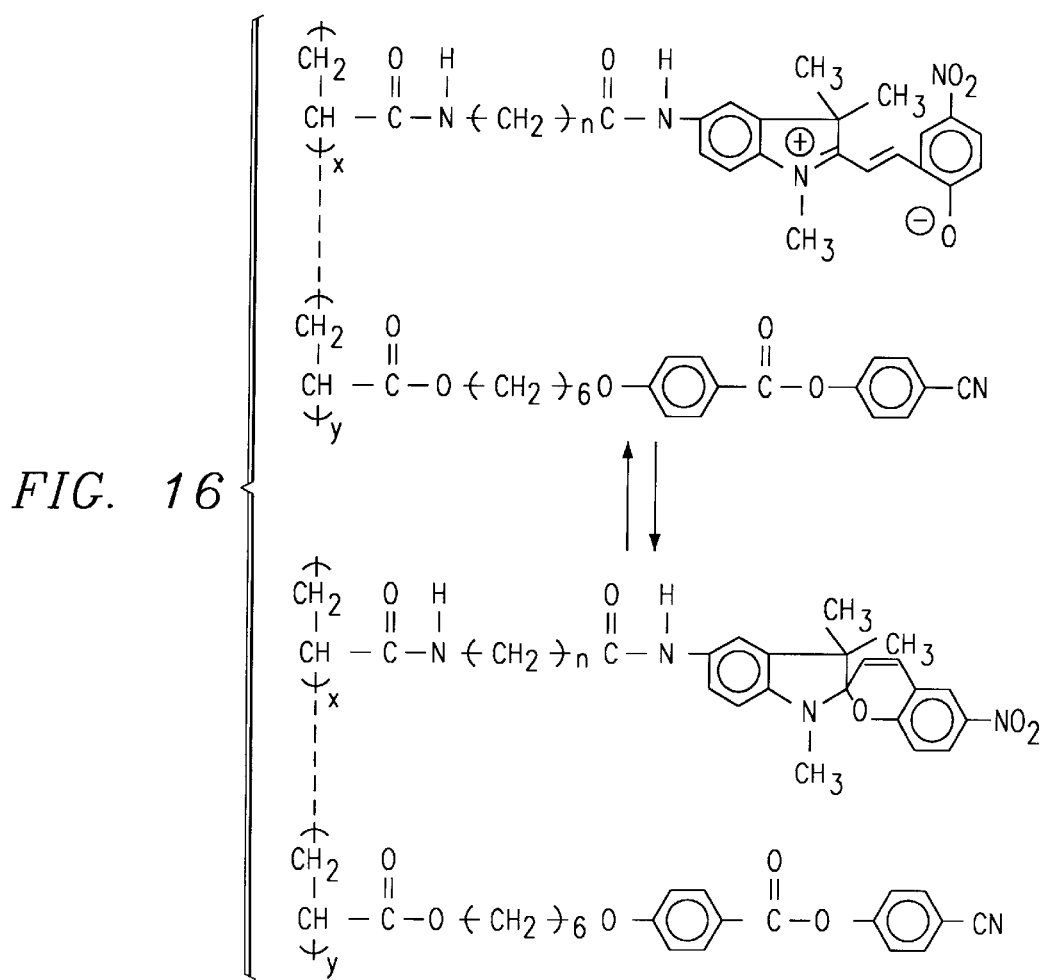
FIG. 16 shows an example of an aromatic ring suitable to form mesogens or monomers for polymer liquid crystals.

Another example of an aromatic ring suitable to form mesogens 1320 and 1220 and monomers 1120 is the photochromic liquid crystal polyacrylate depicted in FIG. 16.

In an alternate embodiment, ARC layer 203 is formed using chemical vapor deposition rather than a spin on method. In another alternate embodiment, photoresist layer 204 is formed using chemical vapor deposition.

In an alternate embodiment, the electrically polarizable liquid polymer is replaced with a magnetically polarizable material. The applied DC electric field in step 140 is replaced with a magnetic field or an alternating electric field with the field direction pointing in a direction substantially normal to the plane of the interface between ARC layer 203 and photoresist layer 204.

Although the present invention has been described with reference to a conducting layer and has particular relevance to metals because of their highly reflective surfaces, the present teachings apply to patterning non-conductive and non-metallic layers as well. Furthermore, the present invention is not limited to the specific examples of polymer liquid crystals given. Any electrically polarizable polymer liquid crystal will suffice. However, the examples given are the presently preferred polymer liquid crystals.

The methods of forming individual layers in the wafer are given merely as examples. Other methods of forming layers other than chemical vapor deposition and spin-on techniques are applicable as well The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

What is claimed is:

1. A method of fabricating an integrated circuit comprising the steps of:
    forming an antireflective coating on a substrate wherein said antireflective coating is electrically polarizable;
    forming a photoresist coating on said antireflective coating on a side opposite from said substrate; and
    exposing said photoresist to activating radiation while said antireflective coating is being subjected to an applied electric field at substantially the same time wherein the radiation absorption coefficient of said antireflective coating is increased and the refractive index of said antireflective coating is changed to be substantially equal to the refractive index of said photoresist coating.

2. The method of claim 1 further comprising a step of developing said photoresist.

3. The method of claim 2 further comprising a step of etching said antireflective coating and said substrate to remove material from a first area.

4. The method of claim 3 further comprising a step of removing said antireflective coating and said photoresist coating.

5. The method of claim 1 wherein said applied electric field is greater than 100 volts DC.

6. The method of claim 1 wherein said applied electric field is less than 200 volts DC.

7. The method of claim 1 wherein said forming an antireflective coating is performed using a spin on technique.

8. The method of claim 1 wherein said forming an antireflective coating is performed using chemical vapor deposition.

9. The method of claim 1 wherein said forming said photoresist coating is performed using a spin on technique.

10. The method of claim 1 wherein said forming said photoresist coating is performed using chemical vapor deposition.

11. The method of claim 1 wherein said antireflective coating comprises a polymer liquid crystal material.

12. The method of claim 11 wherein said polymer liquid crystal material comprises a photochromic liquid crystal polyacrylate.

13. The method of claim 11 wherein said polymer liquid crystal material comprises a main chain polymer liquid crystal.

14. The method of claim 11 wherein said polymer liquid crystal material comprises a side chain polymer liquid crystal.

15. The method of claim 1 wherein said electric field is applied in a direction substantially normal to the interface between said antireflective coating and said photoresist coating.

16. The method of claim 1 wherein said antireflective coating is about 0.07 microns to about 0.15 microns thick.

17. The method of claim 1 wherein said antireflective coating is approximately 0.1 microns thick.

18. The method of claim 1, wherein the activating radiation is composed of electrons.

19. The method of claim 1, wherein the substrate is glass or quartz.

20. A method of fabricating an integrated circuit comprising the steps of:
    forming an antireflective coating on a substrate wherein said antireflective coating is magnetically polarizable;
    forming a photoresist coating on said antireflective coating on a side opposite from said substrate; and
    exposing said photoresist to activating radiation and subjecting said antireflective coating to an applied electromagnetic field at substantially the same time whereby the radiation absorption coefficient of said antireflective coating is increased and the refractive index of said antireflective coating is changed to be substantially equal to the refractive index of said photoresist coating.

21. The method of claim 20 wherein said applied electromagnetic field is an AC electric field.

22. The method of claim 20 wherein said applied electromagnetic field is a magnetic field.

23. The method of claim 20 wherein said electromagnetic field is applied in a direction substantially normal to the interface between said antireflective coating and said photoresist coating.

24. A method of fabricating an integrated circuit comprising the steps of:

forming an antireflective coating on a substrate wherein said antireflective coating is polarizable;

forming a photoresist coating on said antireflective coating on a side opposite from said substrate; and exposing said photoresist to activating radiation while said antireflective coating is being subjected to an applied field at substantially the same time wherein the radiation absorption coefficient of said antireflective coating is increased and the refractive index of said antireflective coating is changed to be substantially equal to the refractive index of said photoresist coating.

25. The method of claim 24, wherein the antireflective coating is electrically polarizable and wherein the applied field is an electric field.

26. The method of claim 24, wherein the antireflective coating is magnetically polarizable and wherein the applied field is a magnetic field.

* * * * *